United States Patent
Xu et al.

(10) Patent No.: US 10,644,684 B2
(45) Date of Patent: May 5, 2020

(54) CLOCK COMPENSATION CIRCUIT, CLOCK CIRCUIT, AND MICROCONTROLLER

(71) Applicant: Gree Electric Appliances, Inc. of Zhuhai, Guangdong (CN)

(72) Inventors: Yijun Xu, Guangdong (CN); Xinchao Peng, Guangdong (CN); Liang Zhang, Guangdong (CN); Yuming Feng, Guangdong (CN)

(73) Assignee: Gree Electric Appliances, Inc. of Zhuhai, Guangdong (CN)

( * ) Notice: Subject to any disclaimer, the term of this patent is extended or adjusted under 35 U.S.C. 154(b) by 0 days.

(21) Appl. No.: 16/331,057

(22) PCT Filed: Jul. 11, 2017

(86) PCT No.: PCT/CN2017/092482
§ 371 (c)(1),
(2) Date: Mar. 6, 2019

(87) PCT Pub. No.: WO2018/090650
PCT Pub. Date: May 24, 2018

(65) Prior Publication Data
US 2019/0267976 A1     Aug. 29, 2019

(30) Foreign Application Priority Data

Nov. 18, 2016   (CN) .......................... 2016 1 1015057

(51) Int. Cl.
*H03K 5/135*     (2006.01)
*H03K 3/011*     (2006.01)

(52) U.S. Cl.
CPC ............. *H03K 5/135* (2013.01); *H03K 3/011* (2013.01)

(58) Field of Classification Search
CPC combination set(s) only.
See application file for complete search history.

(56) References Cited

U.S. PATENT DOCUMENTS

2018/0198451 A1*   7/2018   Jung ..................... H03L 1/022

FOREIGN PATENT DOCUMENTS

| CN | 101436851 A | 5/2009 |
|----|-------------|--------|
| CN | 102412830 A | 4/2012 |

(Continued)

OTHER PUBLICATIONS

International Search Report, dated Sep. 26, 2017, in International application No. PCT/CN2017/092482, filed on Jul. 11, 2017.

*Primary Examiner* — An T Luu
(74) *Attorney, Agent, or Firm* — McAndrews, Held & Malloy, Ltd.

(57) ABSTRACT

Disclosed are a clock compensation circuit, a clock circuit and a microcontroller. The clock compensation circuit may include: a detection circuit, configured to detect a capacitance control parameter capable of affecting a clock frequency output by a clock circuit; and a control unit, connected with the detection circuit, and configured to adjust a capacitance value of a target capacitor in the clock circuit according to the capacitance control parameter detected by the detection circuit, so as to change the clock frequency output by the clock circuit. With the clock compensation circuit, the clock circuit and the microcontroller, the problem of large fluctuation of a clock frequency output by a clock circuit in the related art is solved.

8 Claims, 7 Drawing Sheets

(56) References Cited

FOREIGN PATENT DOCUMENTS

| CN | 102571080 A | 7/2012 |
| CN | 102594345 A | 7/2012 |
| CN | 102694523 A | 9/2012 |
| CN | 103873048 A | 6/2014 |
| CN | 104807561 A | 7/2015 |
| CN | 106656120 A | 5/2017 |

\* cited by examiner

CLOCK COMPENSATION CIRCUIT, CLOCK CIRCUIT, AND MICROCONTROLLER

TECHNICAL FIELD

The present disclosure relates to the field of circuit design, and in particular to a clock compensation circuit, a clock circuit and a microcontroller.

BACKGROUND

A clock is taken as an important element in a microcontroller, and its high precision and wide power supply working range are of great significance to improve the performance of a whole chip. Generally, a Remote Control (RC) clock has a simple structure and is widely applied in an integrated circuit. However, the precision of the RC clock is often limited by the precision of an internal resistor and a capacitor, a power supply and a temperature, and cannot be very high under a full temperature and a full voltage. In an actual application, a deviation to the precision of the chip caused by frequency fluctuation of the clock in a full-temperature range and a full-voltage range is even up to ±2%. Hence, in the related art, large-range fluctuation in an environmental temperature and a power voltage of a place where the clock is located causes the fluctuation of a frequency clock, and thus the precision of the microcontroller has a large deviation.

Concerning the problem of large fluctuation of a clock frequency output by a clock circuit in the related art, an effective solution hasn't been proposed yet till now.

SUMMARY

A main objective of the present disclosure is to provide a clock compensation circuit, a clock circuit and a microcontroller to solve the problem of large fluctuation of a clock frequency output by a clock circuit in the related art.

To this end, according to one aspect of the present disclosure, there is provided a clock compensation circuit. The clock compensation circuit includes a detection circuit and a control circuit.

The detection circuit is configured to detect a capacitance control parameter capable of affecting a clock frequency output by a clock circuit.

The control unit is connected with the detection circuit, and is configured to adjust a capacitance value of a target capacitor in the clock circuit according to the capacitance control parameter detected by the detection the clock frequency output by the clock circuit.

Further, the detection circuit may include: a power detection circuit, configured to detect a power voltage of the clock circuit and take the power voltage as the capacitance control parameter.

Further, the control unit may include: a first conversion module, configured to convert an analog signal corresponding to the power voltage detected by the power detection circuit into a first digital signal; a first transmission module, configured to input the first digital signal to a control end of the target capacitor; and a first control module, configured to adjust the capacitance value of the target capacitor according to the first digital signal, so as to change the clock frequency output by the clock circuit.

Further, the detection circuit may further include: a temperature detection circuit, configured to detect an environmental temperature of an environment where the clock circuit is located and take the environmental temperature as the capacitance control parameter.

Further, the control unit may further include: a second conversion module, configured to convert an analog signal corresponding to the environmental temperature detected by the temperature detection circuit into a second digital signal; a second transmission module, configured to input the second digital signal to the control end of the target capacitor; and a second control module, configured to adjust the capacitance value of the target capacitor according to the second digital signal, so as to change the clock frequency output by the clock circuit.

Further, the second control module may include: a first comparison sub-module, configured to compare a value of the detected environmental temperature with a value of a preset temperature; a first adjustment sub-module, configured to decrease, under a condition in which the value of the environmental temperature is smaller than the value of the preset temperature by the comparison, the capacitance value of the target capacitor to a first target capacitance value according to the second digital signal; and a second adjustment sub-module, configured to increase, under a condition in which the value of the environmental temperature is greater than the value of the preset temperature by the comparison, the capacitance value of the target capacitor to a second target capacitance value according to the second digital signal.

Further, the first control module may include: a second comparison sub-module, configured to compare a value of the power voltage with a value of a preset voltage; a third adjustment sub-module, configured to decrease, under a condition in which the value of the power voltage is smaller than the value of the preset voltage by the comparison, the capacitance value of the target capacitor to a third target capacitance value according to the first digital signal; and a fourth adjustment sub-module, configured to increase, under a condition in which the value of the power voltage is greater than the value of the preset voltage, the capacitance value of the target capacitor to a fourth target capacitance value according to the first digital signal.

Further, the detection circuit y further include: a comparator circuit, disposed in the detection circuit, and configured to perform analog-to-digital conversion processing on the capacitance control parameter detected by the detection circuit so as to convert the capacitance control parameter into a corresponding digital signal, where the control unit is configured to adjust the capacitance value of the target capacitor according to the corresponding digital signal to change the clock frequency output by the clock circuit.

To this end, according to another aspect of the present disclosure, there is provided a clock circuit, which may include a target capacitor capable of changing a clock frequency output by the clock circuit, and the clock compensation circuit.

To this end, according to another aspect of the present disclosure, there is provided a microcontroller, which may include the clock circuit.

Based on the above any implementation solution of the present disclosure, by detecting the capacitance control parameter of the target capacitor for controlling the clock frequency output by the clock circuit and adjusting the capacitance value of the target capacitor, the adjustment on the clock frequency output by the clock circuit is implemented; and thus, the clock compensation circuit of the present disclosure can compensate the clock circuit according to a demand to reduce the fluctuation of the clock frequency output by the clock circuit.

BRIEF DESCRIPTION OF THE DRAWINGS

The accompanying drawings are described here to provide further understanding of the present disclosure, and form a part of the present disclosure. The schematic embodiments and description of the present disclosure are adopted to explain the present disclosure, and do n the present disclosure. In the drawings.

DETAILED DESCRIPTION OF THE EMBODIMENTS

It is to be noted that the embodiments of the present application and the characteristics of the embodiments may be combined with each other if there is no conflict. The present disclosure is described below in detail with reference to accompanying drawings and in combination with the embodiment.

In order to make those skilled in the art better understand the solutions of the present disclosure, the following clearly and completely describes the technical solutions in the embodiments of the present disclosure with reference to the accompanying drawings in the embodiments of the present disclosure. Apparently, the described embodiments are a part rather than all of the embodiments of the present disclosure. All other embodiments obtained by a person of ordinary skill in the art based on the embodiments of the present disclosure without creative efforts shall fall within the protection scope of the present disclosure.

It should be noted that, terminologies such as "first" and "second" in the specification, claims and accompanying drawings of the present disclosure are only used to distinguish similar objects, rather than to describe a special order or a precedence order. It should be understood that data used in such a way may be interchangeable in a certain cases, such that the embodiments of the present disclosure described here can be implemented in an order other than those illustrated or described here. As used herein, the terms "comprises," "comprising," "includes," "including," "has," "having" or any other variation thereof are intended to cover a non-exclusive inclusion. For example, a process, method, article, or apparatus that comprises a list of steps or units is not necessarily limited to only those steps or units but may include other steps or units not expressly listed or inherent to such process, method, article, or apparatus.

According to an embodiment of the present disclosure, there is provided a clock compensation circuit.

Figure 1:
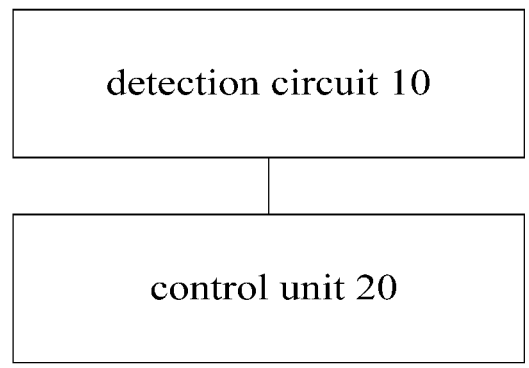
FIG. 1 shows a schematic diagram of a clock compensation circuit provided according to an embodiment of the present disclosure.

FIG. 1 is a schematic diagram of a clock compensation circuit provided according to an embodiment of the present disclosure. As shown in FIG. 1, the clock compensation circuit may include the following structures.

A detection circuit 10 is configured to detect a capacitance control parameter capable of affecting a clock frequency output by a clock circuit.

In the present disclosure, the capacitance control parameter capable of affecting the clock frequency output by the clock circuit is detected by the detection circuit 10 in the clock compensation circuit. In the present disclosure, a target capacitor is disposed in the clock circuit, and its capacitance value is adjustable. The change to the clock frequency output by the clock circuit can be implemented according to a digital signal input to a control end of the target capacitor.

A control unit 20 is connected with the detection circuit 10, and is configured to adjust the capacitance value of the target capacitor according to the capacitance control parameter detected by the detection circuit 10, so as to change the clock frequency output by the clock circuit.

The control unit 20 connected with the detection circuit 10 in the clock compensation circuit can adjust the capacitance value of the target capacitor according to the capacitance control parameter detected by the detection circuit 10, and thus changes the clock frequency output by the clock circuit.

Through the detection circuit 10 and the control unit 20 in the clock compensation circuit of the present disclosure, the clock circuit can be compensated according to a demand, and thus the clock frequency output by the clock circuit is changed, and the fluctuation of the clock frequency output by the clock circuit is reduced.

Optionally, in the clock compensation circuit provided by this embodiment of the present disclosure, the detection circuit 10 may include: a power detection circuit 10, configured to detect a power voltage in the clock circuit and take the power voltage as the capacitance control parameter.

Specifically, when the power voltage is h capacitance control parameter, the detection circuit 10 in the clock compensation circuit provided by this embodiment of the present disclosure may include the power detection circuit configured to detect the power voltage of the clock circuit. The power detection circuit in the detection circuit 10 detects the power voltage of the clock circuit, and adjusts the capacitance value of the target capacitor according to the power voltage, so as to change the clock frequency output by the clock circuit.

Optionally, in the clock compensation circuit provided by this embodiment of the present disclosure, the control unit 20 may include: a first conversion module, configured to convert an analog signal corresponding to the power voltage detected by the detection circuit 10 (specifically the power detection circuit) into a first digital signal; a first transmission module, configured to input the first digital signal to the control end of the target capacitor; and a first control module, configured to control the capacitance value of the target capacitor according to the first digital signal, so as to change the clock frequency output by the clock circuit.

For example, the detection circuit 10 detects that the power voltage of the clock circuit is 5.3V. The first conversion module converts the analog signal corresponding to the power voltage detected by the power detection circuit into the first digital signal, i.e., the first conversion module converts the 5.3V into the first digital signal. The first control module controls the capacitance value of the target capacitor according to the first digital signal in a circuit where the target capacitor is located so as to change the clock frequency output by the clock circuit. It is to be noted that each figure in the above example is merely for the convenience of description, and does not represent a figure adjusted normally in an actual circuit operation process.

Optionally, in the clock compensation circuit provided by this embodiment of the present disclosure, the first control module may include: a second comparison sub-module, configured to compare a value of the power voltage and a preset voltage; a third adjustment sub-module, configured to decrease, under a condition in which the power voltage is smaller than the preset voltage by the comparison, the capacitance value of the target capacitor to a third target capacitance value according to the first digital signal; and a fourth adjustment sub-module, configured to increase, under a condition in which the value of the power voltage is greater than the value of the preset voltage, the capacitance value of the target capacitor to a fourth target capacitance value according to the first digital signal.

For example, the power voltage at which the clock circuit operates ranges from 2.7V to 5.5V, and the preset voltage is 5V. The second comparison sub-module performs the value comparison on the detected power voltage and the preset voltage. In a case where the detected power voltage is 4.5V and is smaller than the preset voltage 5V, and the capacitance value of the target capacitor is 110 F, and an adjustable range of the target capacitor is 50 F-550 F, under a condition in which the value of the power voltage is smaller than the value of the preset voltage by the comparison, the third adjustment sub-module decreases the capacitance value 110 F of the target capacitor to 100 F. In a case where the detected power voltage is 5.3V and is greater than the preset voltage 5V, under a condition in which the power voltage is greater than the preset voltage by the comparison, the fourth adjustment sub-module increases the capacitance value 110 F of the target capacitor to 130 F. It is to be noted that each figure in the above example is merely for the convenience of description, and does not represent a figure adjusted normally in an actual circuit operation process.

Optionally, in the clock compensation circuit provided by this embodiment of the present disclosure, the detection circuit 10 may further include: a temperature detection circuit, configured to detect an environmental temperature of an environment where the clock circuit is located and take the environmental temperature as the capacitance control parameter.

Specifically, when the environmental temperature is the capacitance control parameter, the detection circuit 10 in the clock compensation circuit provided by this embodiment of the present disclosure may include the temperature detection circuit configured to detect the environmental temperature of the environment where the clock circuit is located. The control unit controls the target capacitor according to the environmental temperature, detected by the temperature detection circuit, of the environment where the clock circuit is located, so as to change the clock frequency output by the clock circuit.

Optionally, in the clock compensation circuit provided by this embodiment of the present disclosure, the control unit 20 may further include: a second conversion module, configured to convert an analog signal corresponding to the environmental temperature detected by the detection circuit 10 into a second digital signal; a second transmission module, configured to input the second digital signal to the control end of the target capacitor; and a second control module, configured to adjust the capacitance value of the target capacitor according to the second digital signal, so as to change the clock frequency output by the clock circuit.

It is to be noted that, in this embodiment of the present disclosure, a mapping relationship between an environmental temperature and a voltage value is established in advance. For example, the detection circuit 10 detects that the environmental temperature of the environment where the clock circuit is located is 25° C. and the voltage value corresponding to the environmental temperature 25° C. is 5V, the detection circuit 10 detects that the environmental temperature of the environment where the clock circuit is located is 26° C. and the voltage value corresponding to the environmental temperature 26° C. is 5.1V, and the like. The analog signal corresponding to the environmental temperature detected by the temperature detection circuit specifically is an analog signal corresponding to the voltage value that corresponds to the environmental temperature detected by the temperature detection circuit, i.e., the second conversion module converts the analog signal corresponding to the voltage value that corresponds to the environmental temperature detected by the temperature detection circuit into the second digital signal; and the second control module adjusts the capacitance value of the target capacitor according to the second digital signal, so as to change the clock frequency output by the clock circuit. It is to be noted that each figure in the above example is merely for the convenience of description, and does not represent a figure adjusted normally in an actual circuit operation process and only illustrates a technology in the present disclosure.

Optionally, in the clock compensation circuit provided by this embodiment of the present disclosure, the second control module may include: a first comparison sub-module, configured to compare a value of the detected environmental temperature and a preset temperature; a first adjustment sub-module, configured to decrease, under a condition in which the value of the environmental temperature smaller than the value of the preset temperature, the capacitance value of the target capacitor to a first target capacitance value according to the second digital signal; and a second adjustment sub-module, configured to increase, under a condition in which the value of the environmental temperature is greater than the value of the preset temperature, the capacitance value of the target capacitor to a second target capacitance value according to the second digital signal.

For example, the environmental temperature of the environment where the clock circuit is located ranges from −40° C. to 125° C., and the preset temperature is 25° C. The first comparison sub-module compares a value of the detected environmental temperature with a value of a preset temperature. In a case where the detected environmental temperature is 15° C. and is smaller than the preset temperature 25° C., and an adjustable range of the target capacitor is 50-550 F and the capacitance value of the target capacitor is 110 F, under a condition in which the temperature is smaller than the preset temperature by the comparison, the first adjustment sub-module decreases the capacitance value 110 F of the target capacitor to 100 F. In a case where the detected environmental temperature is 27° C. and is greater than the preset temperature 25° C., under a condition in which the temperature is greater than the preset temperature by the comparison, the second adjustment sub-module increases the capacitance value 110 F of the target capacitor to 130 F. It is to be noted that each figure in the above example is merely for the convenience of description, and does not represent a figure adjusted normally in an actual circuit operation process.

Optionally, in the clock compensation circuit provided by this embodiment of the present disclosure, the detection circuit 10 may further include: a comparator circuit, disposed in the detection circuit 10, and configured to perform analog-to-digital conversion processing on the capacitance control parameter detected by the detection circuit 10 so as to convert the capacitance control parameter into a corresponding digital signal, where the control unit 20 is specifically configured to control the target capacitor according to the corresponding digital signal to change the clock frequency output by the clock circuit.

In the present disclosure, a comparator in the comparator circuit converts, according to own characteristics that a high level is output when a potential at a forward input end is higher than a reverse input end, and a low level is output when a potential at he reverse input end is higher than the forward input end, the analog signal detected by the detection circuit 10 and corresponding to the capacitor control parameter into a corresponding digital signal. For example, the corresponding digital signal is 101010011; and the control end of the target capacitor is controlled according to this binary code so as to change the clock frequency output by the clock circuit.

It is to be noted that, in the structure of the clock compensation circuit of the present disclosure, within a low-voltage range, according to an actual precision demand, a plurality of comparator circuits are increased. Moreover, it is necessary to provide a hysteresis voltage inside each of the comparator circuits, so as to ensure that digital signals are not generated by comparators in a mess. Since the output clock frequency of the clock circuit is in a linear relationship with the environmental temperature, digits controlled digitally are designed on the premise of guaranteeing the precision according to an actual temperature range. With the hysteresis voltages inside the comparator circuits, it is ensured that the digital signals are not generated by the comparators in a mess.

With the clock compensation circuit provided by this embodiment of the present disclosure, the detection circuit 10 detects the capacitance control parameter capable of affecting the clock frequency output by the clock circuit, and the control unit 20 adjusts the capacitance value of the target capacitor in the clock circuit according to the capacitance control parameter detected by the detection circuit, so as to change the clock frequency output by the clock circuit, so the problem of large fluctuation of a clock frequency output by a clock circuit in the related art is solved. The capacitance value of the target capacitor in the clock circuit is adjusted according to the capacitance control parameter detected by the detection circuit 10, so that the clock frequency output by the clock circuit is changed, and thus the effect of reducing the fluctuation of the clock frequency output by the clock circuit is achieved.

Figure 2:
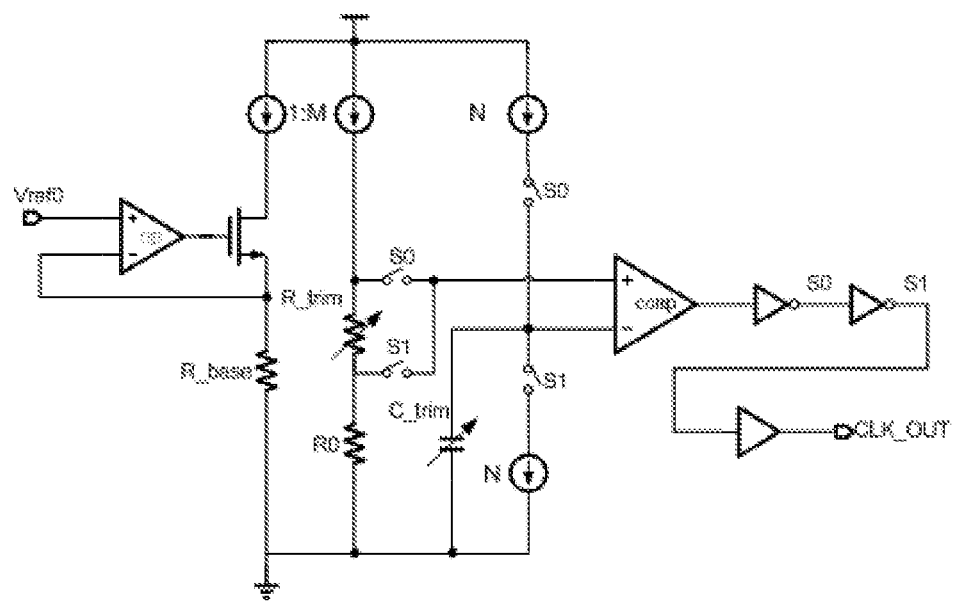
FIG. 2 shows a structural diagram of a clock circuit in the related art.
Figure 3:
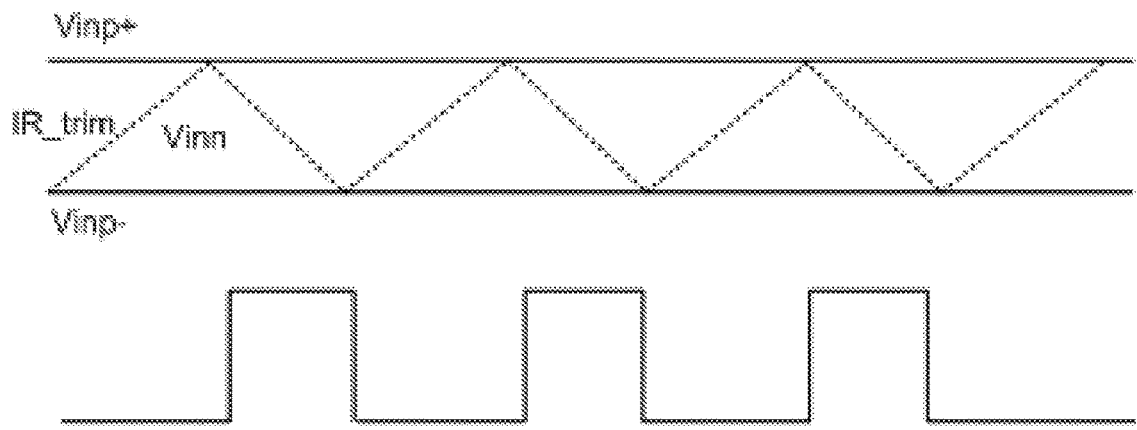
FIG. 3 shows a working principle diagram of a clock circuit in the related art.

The present disclosure is described below with comparative descriptions. FIG. 2 is e structural diagram of a clock circuit in the related art. As shown in FIG. 2, a structural diagram of a clock circuit inside a chip having a universal structure is shown in FIG. 2. A current bias in a direct proportion to a reference current source at 1:M is applied to branches of an $R_{trim}$ and an $R_0$. FIG. 3 is a working principle diagram of a clock circuit in the related art. As shown in FIG. 3, a generated voltage bias ($V_{inp+}$ and $V_{inp-}$) jumped along with the clock is applied to one end of a high-speed comparator; the other end of the high-speed comparator charges and discharges a capacitor according to two switchable current sources to obtain a zigzag wave voltage $V_{im}$. The voltages at two ends pass through the high-speed comparator to obtain a square wave clock. Since a capacitance and a resistance in a process when a chip is manufactured actually may have a 20% deviation at most compared with ideal nominal capacitance value and resistance value, it is very difficult that an internal clock circuit made actually reaches a very high precision if there is no calibration circuit. Moreover, even through the internal calibration circuit exists, an about 5% deviation may also be generated due to different working voltages and temperatures of places where the chip is located.

Figure 4:
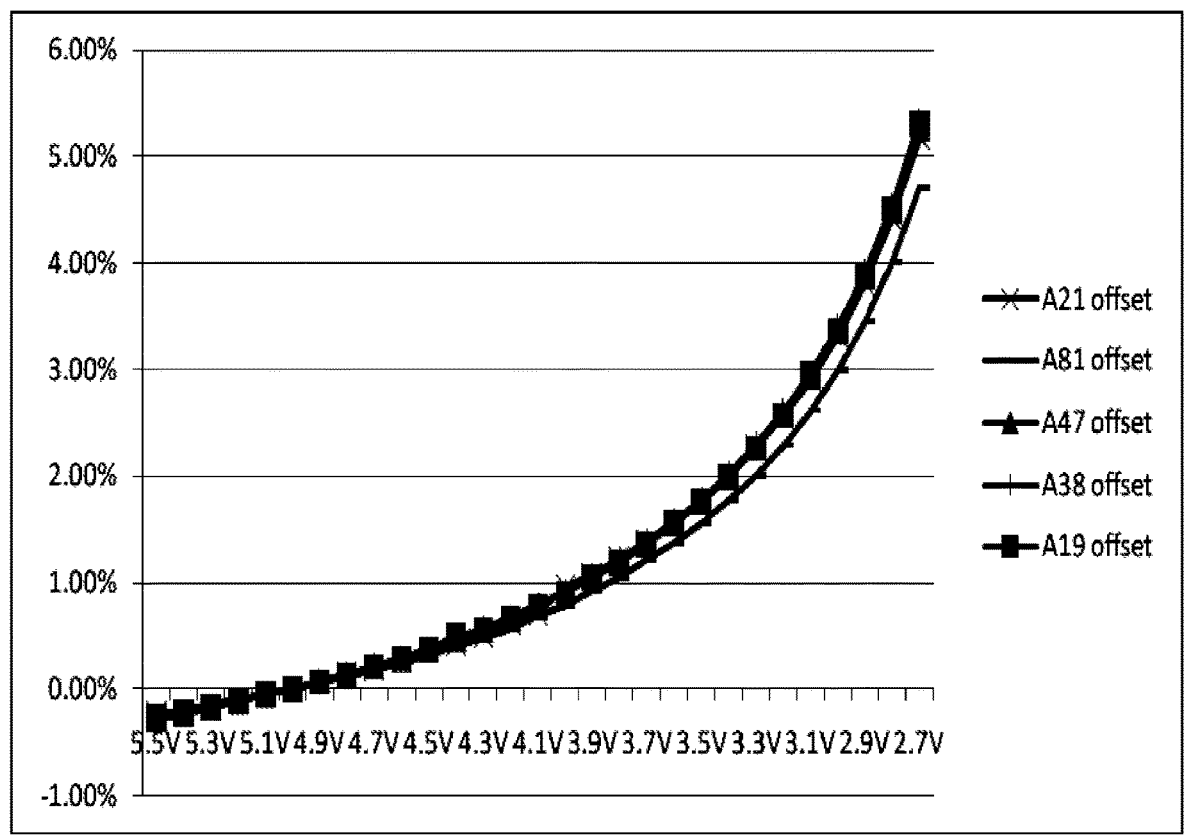
FIG. 4 shows a schematic diagram of a frequency change of a clock circuit in a full-voltage range in the related art.

FIG. 4 is a schematic diagram of a frequency change of a clock circuit in a full-voltage range in the related art. It may be seen from actual test results in FIG. 4 that an output frequency may not be in a linear relationship with a power voltage, but change violently within a range in which the power voltage is low. From FIG. 4, because of the change of the power voltage in a full-voltage range, the output frequency changes about 5%.

Figure 5:
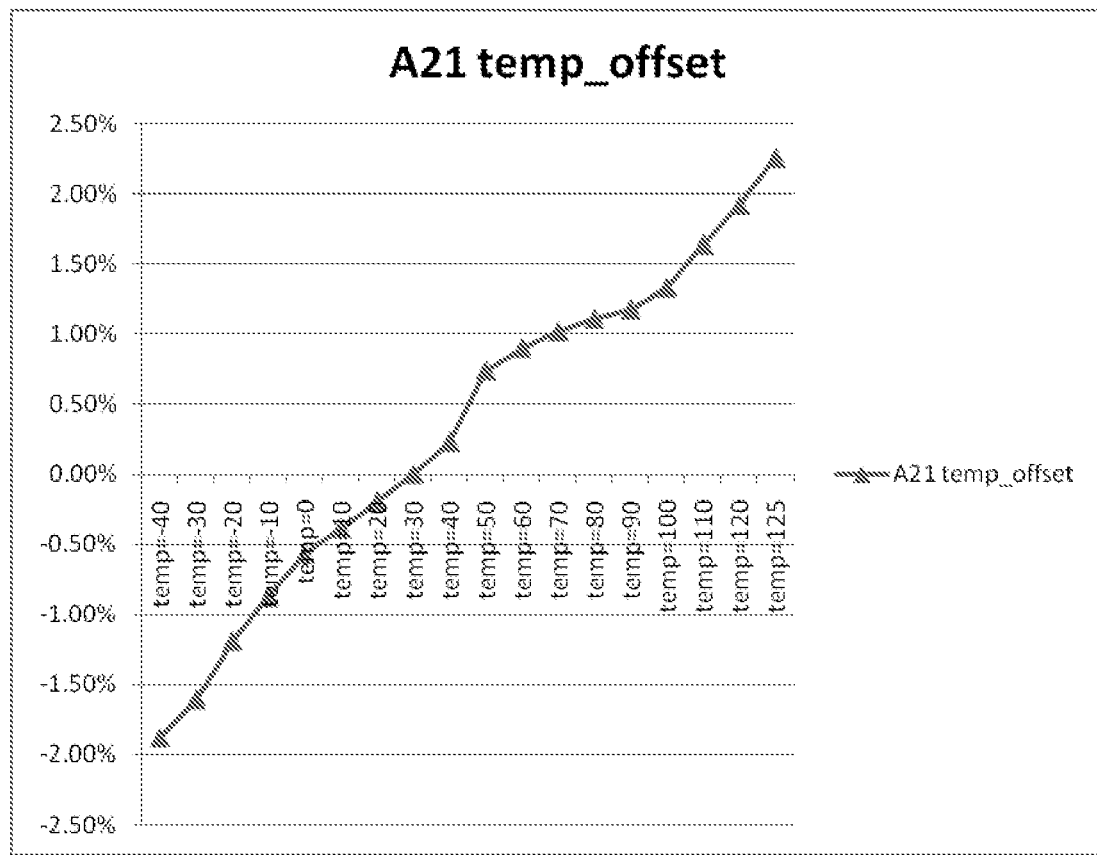
FIG. 5 shows a schematic diagram of a frequency change of a clock circuit in a full-temperature range in the related art.

FIG. 5 is a schematic diagram of a frequency change of a clock circuit in a full-temperature range in the related art. As shown in FIG. 5, an output frequency is in a linear relationship with an environmental temperature. Because of the change of the power voltage in a full-temperature range, the output frequency changes about ±2.5%.

Figure 6:
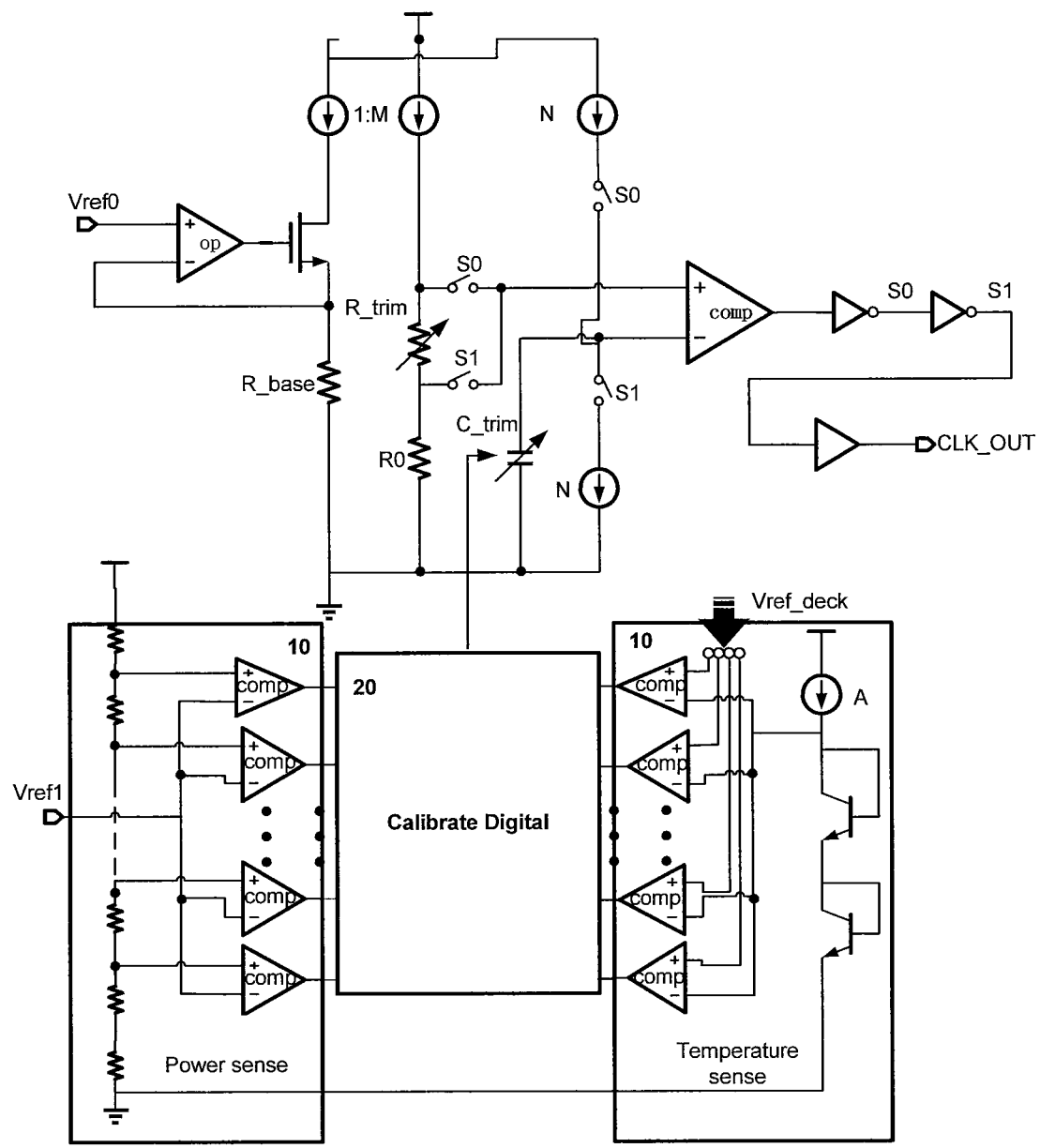
FIG. 6 shows a structural diagram of a clock circuit provided according to an embodiment of the present disclosure.
Figure 9:
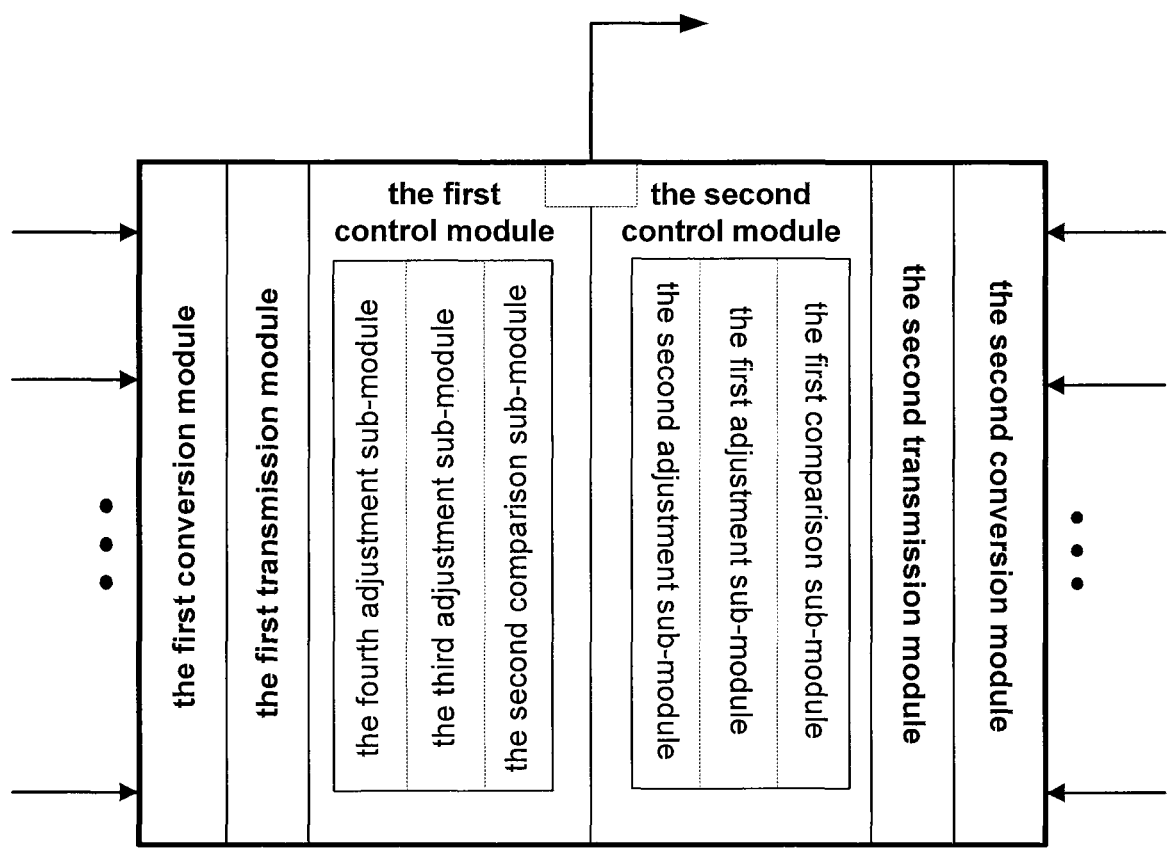
FIG. 9 shows am internal block diagram of a control; unit provided according to an optical embodiment of the present disclosure.

FIG. 6 is a structural diagram of a clock circuit provided according to an embodiment of the present disclosure. The detection circuit in the present disclosure is increased to the circuit in FIG. 6. Specifically, a power detection circuit is increased to detect the power voltage, convert an analog signal corresponding to the power voltage into a binary code (a digital signal corresponding to the analog signal), apply the binary code (the digital signal corresponding to the analog signal) to a C_trim circuit, and control a magnitude of a capacitor connected inside a system loop to adjust an output frequency of the circuit, thereby achieving the effect of automatically compensating the power voltage. Further, FIG. 9 shows an internal block diagram of a control unit 20 provided according to an optional embodiment of the present disclosure.

Figure 7:
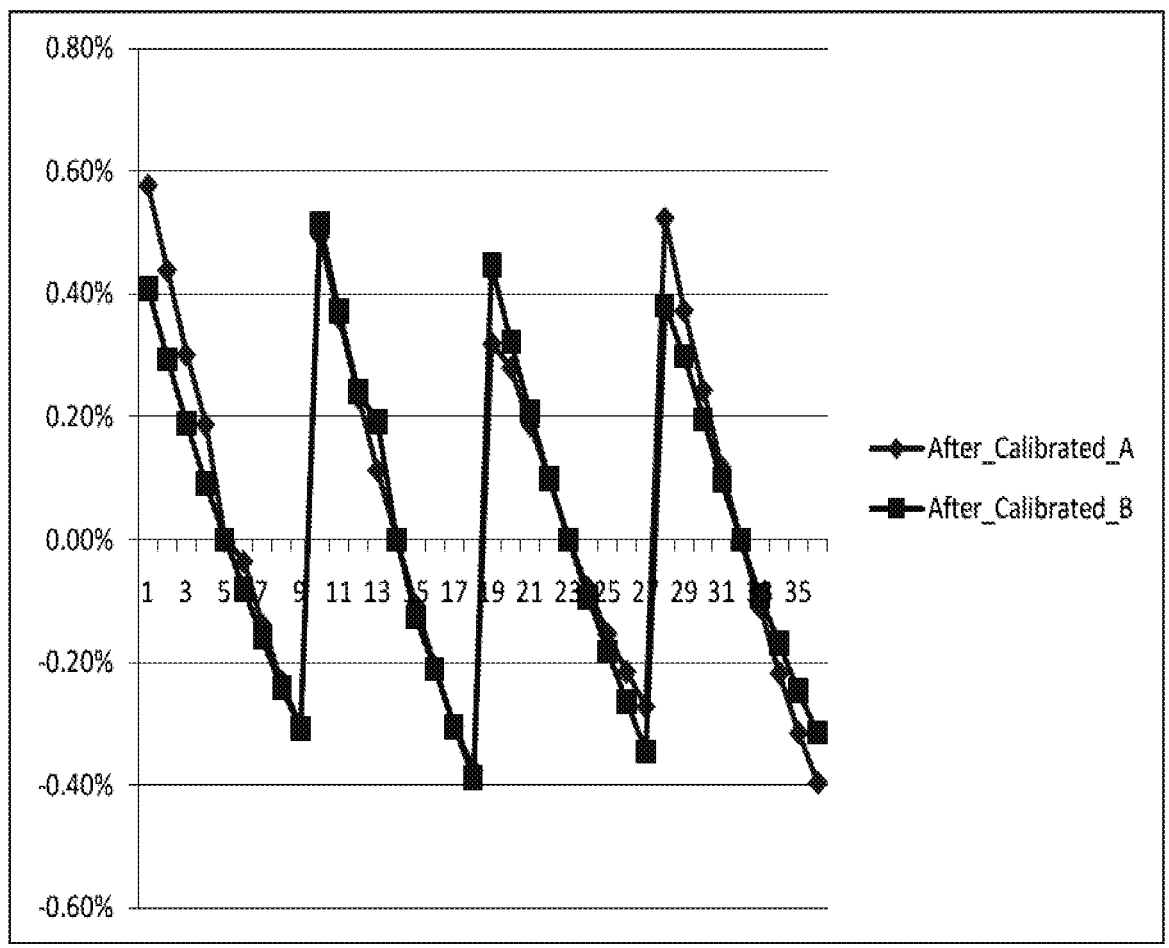
FIG. 7 shows a schematic diagram of a frequency change of a clock circuit in a full-voltage range provided according to an embodiment of the present disclosure

By detecting the clock circuit including the power detection circuit, a result is as shown in FIG. 7. FIG. 7 is a schematic diagram of a frequency change of a clock circuit in a full-voltage range provided according to an embodiment of the present disclosure. It may be seen from actual test results in FIG. 7 that the change in a range which the power voltage is low is stable; and in a full-voltage range, because of the change of the power voltage, the output frequency changes about ±0.6%. In other words, the power voltage of the clock circuit is compensated automatically, so that the clock frequency output by the clock circuit is adjusted, and the fluctuation of the clock frequency output by the clock circuit is reduced.

Optionally, another detection circuit in the present disclosure is further increased to the circuit in FIG. 6. Specifically, the temperature detection circuit is increased to convert an analog signal corresponding to the environmental temperature of the environment where the clock circuit is located into a binary code (a digital signal corresponding to the analog signal), apply the binary code (the digital signal corresponding to the analog signal) to the $C_{\_trim}$ circuit, and control a magnitude of a capacitor connected inside the system loop to adjust the output frequency of the circuit, thereby achieving the effect of automatically compensating the temperature.

Figure 8:
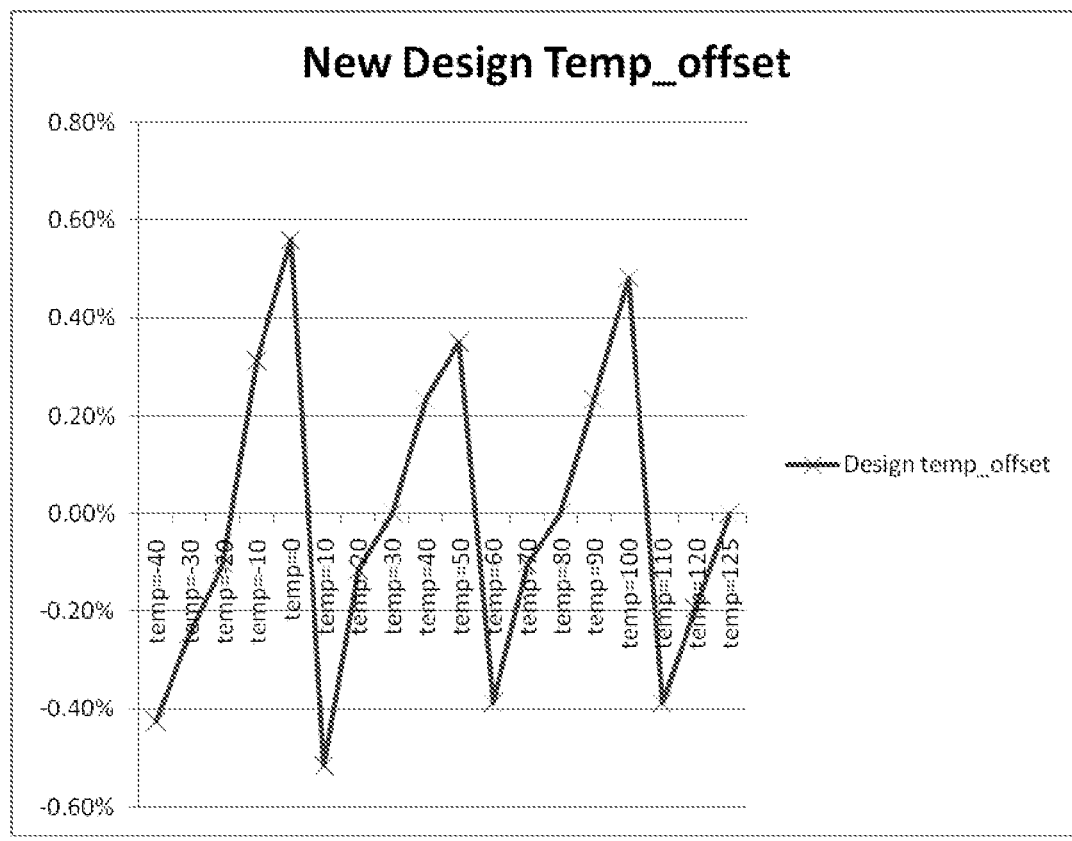
FIG. 8 shows a schematic diagram of a frequency change of a clock circuit in a full-temperature range provided according to an embodiment of the present disclosure.

By detecting the clock circuit including the temperature detection circuit, a result is as shown in FIG. 8. FIG. 8 is a schematic diagram of a frequency change of a clock circuit in a full-temperature range provided according to an embodiment of the present disclosure. It may be seen from actual test results in FIG. 8 that the change in the full-temperature range is stable, and ±0.6% precision in the full-temperature range can be achieved. In other words, the temperature of the clock circuit is compensated automatically, so that the clock frequency output by the clock circuit is adjusted, and the fluctuation of the clock frequency output by the clock circuit is reduced.

An embodiment of the present disclosure further provides a clock circuit. The clock circuit may include a target capacitor capable of changing a clock frequency output by the clock circuit, and any clock compensation circuit provided by the embodiments of the present disclosure. In the clock circuit of the any clock compensation circuit provided by the present disclosure, by adjusting the clock frequency output by the clock circuit, the fluctuation of the clock frequency is reduced, and thus the effect of reducing a deviation of the precision of a microcontroller is achieved, and the effect of reducing the fluctuation of the clock frequency output by the clock circuit is achieved.

It is to be noted that the clock compensation circuit included in the clock circuit is the same or similar to the clock compensation circuit in the above embodiment, and relevant specific contents or functions are described in detail in the above embodiment and will not be repeated herein.

An embodiment of the present disclosure further provides a microcontroller. The microcontroller includes a clock circuit provided by the embodiments of the present disclosure. With the microcontroller provided by the present disclosure, by adjusting the clock frequency output by the clock circuit, the fluctuation of the clock frequency output by the clock circuit is reduced, and thus the effect of reducing a deviation of the precision of a microcontroller is achieved, and the effect of reducing the fluctuation of the clock frequency output by the clock circuit is achieved.

It is to be noted that the above embodiments are expressed as a combination of a series of actions for the simplicity of description. A person skilled in the art should know that the present disclosure is not limited the described action sequence because some steps may be performed by using other sequences or performed simultaneously according to the present disclosure. On the other hand, the person skilled in the art should know that the embodiments described in the specification are preferred embodiments, and relevant actions and modules are unnecessarily required by the present disclosure.

In the above embodiments of the present disclosure, each embodiment is described with its emphasis. A portion not detailed in some embodiment may be referred to related description of other embodiments.

The modules described as separate parts may or may not be physically separated, and parts displayed as modules may or may not be physical modules, and namely may be located in the same place, or may also be distributed to multiple network modules. Part or all of the modules may be selected to achieve the purpose of the solutions of the embodiments according to a practical requirement.

In addition, each function module in each embodiment of the present disclosure may be integrated into a processing module, each module may also exist independently, and two or more than two module may also be integrated into a module. The integrated module may be implemented in a hardware form, and may also be implemented in form of hardware and software function module.

It is apparent that the person skilled in the art should know that each module of the present disclosure may be implemented by a universal computing device, and the modules may be concentrated on a single computing device or distributed on a network formed by a plurality of computing devices, and may optionally be implemented by program codes executable for the computing devices, so that the modules may be stored in a storage device for execution with the computing devices, the shown or described steps may be executed in sequences different from those described here in some circumstances, or may form each integrated circuit module respectively, or multiple modules therein may form a single integrated circuit module for implementation. Therefore, the present disclosure is not United to any specific hardware and software combination.

The above are only preferred embodiments of the present disclosure and are not intended to limit the present disclosure. The present disclosure may have various modifications and changes to the person skilled in the art. Any modification, equivalent replacement, improvement and the like made within the spirit and principle of the present disclosure should be included in a scope of protection of the present disclosure.

What is claimed is:

1. A clock compensation circuit, comprising:
   a detection circuit, configured to detect a capacitance control parameter capable of affecting a clock frequency output by a clock circuit;
   a control unit, connected with the detection circuit, and configured to adjust a capacitance value of a target capacitor in the clock circuit according to the capacitance control parameter detected by the detection circuit, so as to change the clock frequency output by the clock circuit
   wherein the detection circuit comprises:
   a power detection circuit, configured to detect a power voltage of the clock circuit and take the power voltage as the capacitance control parameter;
   wherein the control unit comprises:
   a first conversion module, configured to convert an analog signal corresponding to the power voltage detected by the power detection circuit into a first digital signal;
   a first transmission module, configured to input the first digital signal to a control end of the target capacitor; and
   a first control module, configured to adjust a capacitance value of the target capacitor according to the first digital signal, so as to change the clock frequency output by the clock circuit.

2. The circuit as claimed in claim 1, wherein the detection circuit further comprises:
   a temperature detection circuit, configured to detect an environmental temperature of an environment where the clock circuit is located and take the environmental temperature as the capacitance control parameter.

3. The circuit as claimed in claim 2, wherein the control unit further comprises:
   a second conversion module, configured to convert an analog signal corresponding to the environmental temperature detected by the temperature detection circuit into a second digital signal;
   a second transmission module, configured to input the second digital signal to the control end of the target capacitor; and a second control module, configured to adjust the capacitance value of the target capacitor according to the second digital signal, so as to change the clock frequency output by the clock circuit.

4. The circuit as claimed in claim 3, wherein the second control module comprises:
- a first comparison sub-module, configured to compare a value of the detected environmental temperature with a value of a preset temperature;
- a first adjustment sub-module, configured to decrease, under a condition in which the value of the environmental temperature is smaller than the value of the preset temperature, the capacitance value of the target capacitor to a first target capacitance value according to the second digital signal; and
- a second adjustment sub-module, configured to increase, under a condition in which the value of the environmental temperature is greater than the value of the preset temperature, the capacitance value of the target capacitor to a second target capacitance value according to the second digital signal.

5. The circuit as claimed in claim 1, wherein the first control module comprises:
- a second comparison sub-module, configured to compare a value of the power voltage with a value of a preset voltage;
- a third adjustment sub-module, configured to decrease, under a condition in which the value of the power voltage is smaller than the value of the preset voltage, the capacitance value of the target capacitor to a third target capacitance value according to the first digital signal; and
- a fourth adjustment sub-module, configured to increase, under a condition in which the value of the power voltage is greater than the value of the preset voltage, the capacitance value of the target capacitor to a fourth target capacitance value according to the first digital signal.

6. The circuit as claimed in claim 1, wherein the detection circuit further comprises:
- a comparator circuit, disposed in the detection circuit, and configured to perform analog-to-digital conversion processing on the capacitance control parameter detected by the detection circuit so as to convert the capacitance control parameter into a corresponding digital signal,
- wherein the control unit is configured to adjust the capacitance value of the target capacitor according to the corresponding digital signal to change the clock frequency output by the clock circuit.

7. A clock circuit, comprising a target capacitor capable of changing a clock frequency output by the clock circuit, and the clock compensation circuit as claimed in claim 1.

8. A microcontroller, comprising the clock circuit as claimed in claim 7.

* * * * *